(12) United States Patent
Singh

(10) Patent No.: US 9,741,605 B2
(45) Date of Patent: Aug. 22, 2017

(54) REDUCING DEFECTS AND IMPROVING RELIABILITY OF BEOL METAL FILL

(71) Applicant: GLOBALFOUNDRIES Inc., Grand Cayman (KY)

(72) Inventor: Sunil Kumar Singh, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/676,633

(22) Filed: Apr. 1, 2015

(65) Prior Publication Data

US 2016/0190003 A1    Jun. 30, 2016

Related U.S. Application Data

(60) Provisional application No. 62/097,441, filed on Dec. 29, 2014.

(51) Int. Cl.
*H01L 21/768* (2006.01)
*H01L 21/311* (2006.01)

(52) U.S. Cl.
CPC .. *H01L 21/76808* (2013.01); *H01L 21/31144* (2013.01); *H01L 21/76813* (2013.01); *H01L 2924/0002* (2013.01)

(58) Field of Classification Search
None
See application file for complete search history.

(56) References Cited

U.S. PATENT DOCUMENTS

| 2009/0239375 A1* | 9/2009 | Riess | H01L 21/76808 438/640 |
| 2011/0100697 A1* | 5/2011 | Yang | H01L 21/76805 174/262 |
| 2012/0104622 A1* | 5/2012 | Kim | H01L 21/76804 257/774 |
| 2013/0323930 A1* | 12/2013 | Chattopadhyay | H01L 21/02107 438/703 |

(Continued)

*Primary Examiner* — Reema Patel
*Assistant Examiner* — Steven Christopher
(74) *Attorney, Agent, or Firm* — Wayne F. Reinke, Esq.; Heslin Rothenberg Farley & Mesiti P.C.

(57) ABSTRACT

A method of reducing defects in and improving reliability of Back-End-Of-Line (BEOL) metal fill includes providing a starting metallization structure for semiconductor device(s), the metallization structure including a bottom layer of contact(s) surrounded by a dielectric material. The starting metallization structure further includes an etch-stop layer over the bottom layer, a layer of dielectric material over the etch-stop layer, a first layer of hard mask material over the dielectric layer, a layer of work function hard mask material over the first hard mask layer, a second layer of hard mask material over the work function hard mask layer, via(s) to the first hard mask layer and other via(s) into the etch-stop layer. The method further includes protecting the other via(s) while removing the second hard mask layer and the layer of work function hard mask material, and filling the vias with metal. Protecting the other via(s) may include, prior to the removing, filling the other via(s) with an Energy Removal Film (ERF) up to a top surface of the first hard mask layer, and, after the removing, removing the ERF material.

9 Claims, 4 Drawing Sheets

(56) References Cited

U.S. PATENT DOCUMENTS

2015/0262815 A1* 9/2015 Wu .................. H01L 21/02126
 438/702
2015/0364420 A1* 12/2015 Lin .................... H01L 23/5283
 257/775

* cited by examiner

REDUCING DEFECTS AND IMPROVING RELIABILITY OF BEOL METAL FILL

CROSS-REFERENCE TO RELATED APPLICATIONS

This application claims priority under 35 U.S.C. §119 to U.S. Provisional Application No. 62/097,441, filed Dec. 29, 2014, which is hereby incorporated by reference herein in its entirety.

BACKGROUND OF THE INVENTION

Technical Field

The present invention generally relates to the metallization phase of semiconductor fabrication. More particularly, the present invention relates to reducing defects and improving the reliability of Back-End-Of-Line (BEOL) metal fill.

Background Information

In modern semiconductor device fabrication, after the devices are created, for example, transistors, at the so-called "Front-End-Of-Line (FEOL)," electrical connections to the devices are made, also know as "metallization," at the so-called "Back-End-Of-Line (BEOL)." The metallization process includes filling various vias with a conductive material, typically, metal. However, at various points in via creation and metal filling, a number of defects can unintentionally be introduced, affecting the end-use reliability of the connections using the metal-filled vias.

Thus, a need exists for defect reduction and reliability improvement in BEOL metal fills.

SUMMARY OF THE INVENTION

The shortcomings of the prior art are overcome and additional advantages are provided through the provision, in one aspect, of a method of reducing defects in and improving reliability of BEOL metal fill. The method includes providing a starting metallization structure for one or more semiconductor devices, the metallization structure including a bottom layer of one or more contacts surrounded by a dielectric material. The starting metallization structure further includes an etch-stop layer over the bottom layer, a layer of dielectric material over the etch-stop layer, a first layer of hard mask material over the dielectric layer, a layer of work function hard mask material over the first hard mask layer, a second layer of hard mask material over the work function hard mask layer, one or more first vias exposing the first hard mask layer below the one or more first vias and one or more second vias separate from the one or more first vias extending partially into the etch-stop layer. The method further includes protecting the at least one other via while entirely removing the second hard mask layer and the layer of work function hard mask material, and filling the one or more first vias and the one or more second vias with metal. Protecting the one or more second vias includes: prior to the removing, filling the one or more second vias with an Energy Removal Film (ERF) up to a top surface of the first hard mask layer, and after the removing, removing the ERF material.

These, and other objects, features and advantages of this invention will become apparent from the following detailed description of the various aspects of the invention taken in conjunction with the accompanying drawings.

DETAILED DESCRIPTION OF THE INVENTION

Figure 1:
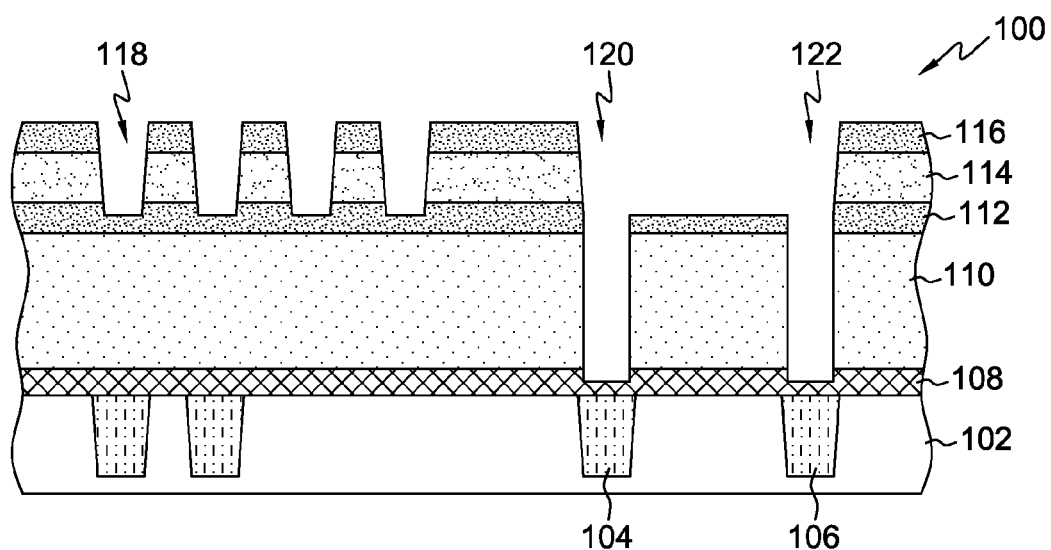
FIG. 1 is a cross-sectional view of one example of a starting metallization structure for one or more semiconductor devices, the starting metallization structure including a bottom layer of one or more contacts, an etch-stop layer over the bottom layer, a layer of dielectric material over the etch-stop layer, a first layer of hard mask material over the dielectric layer, a layer of work function hard mask material over the first hard mask layer, a second layer of hard mask material over the work function hard mask layer, at least one via to the first hard mask layer and at least one other via into the etch-stop layer, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified.

In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 is a cross-sectional view of one example of a starting metallization structure 100 for one or more semiconductor devices, the metallization structure comprising a bottom layer 102 of one or more contacts, e.g., contacts 104 and 106, an etch-stop layer 108 over the bottom layer, a layer 110 of dielectric material over the etch-stop layer, a first layer 112 of hard mask material over the dielectric layer, a layer 114 of work function hard mask material over the first hard mask layer, a second layer 116 of hard mask material over the work function hard mask layer, at least one via (e.g., via 118) to the first hard mask layer and at least one other via (e.g., vias 120, 122) into the etch-stop layer, in accordance with one or more aspects of the present invention. The etch-stop layer may include, for example, a film of nitrogen-doped silicon carbide (SiC:N) or silicon oxynitride (SiON), also known as "NDC."

The starting metallization structure may be conventionally fabricated, for example, using known processes and techniques. However, it will be understood that the fabrication of the starting structure forms no part of the present invention. Further, although only a portion is shown for simplicity, it will be understood that, in practice, many such structures are typically included on the same bulk substrate.

Figure 2:
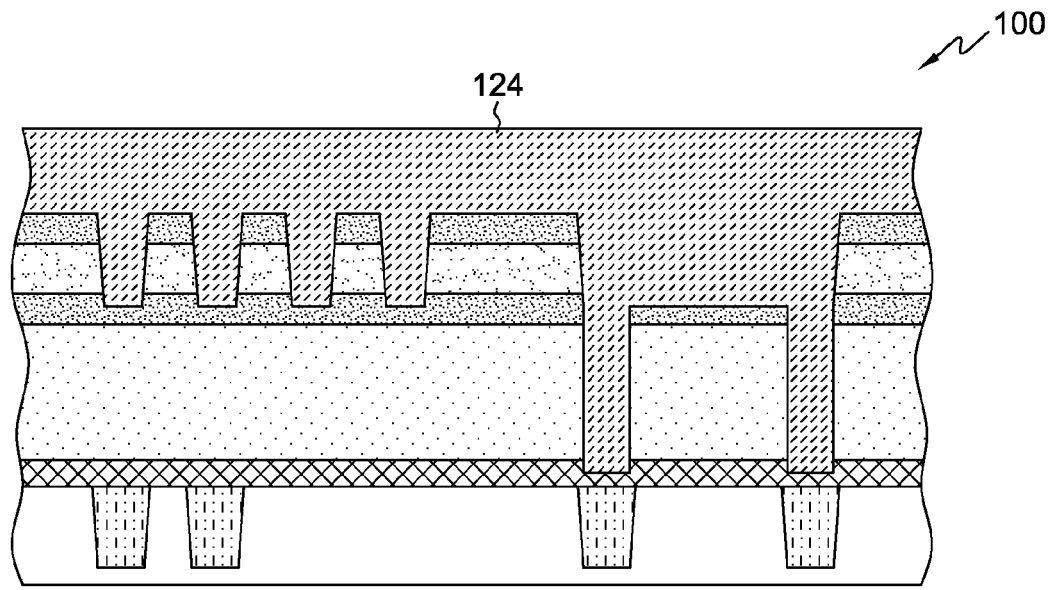
FIG. 2 depicts one example of the starting metallization structure of FIG. 1 after over-filling the vias with an Energy Removal Film (ERF) material, in accordance with one or more aspects of the present invention.

FIG. 2 depicts one example of the starting metallization structure 100 of FIG. 1 after over-filling the vias with an Energy Removal Film (ERF) material 124, in accordance with one or more aspects of the present invention. In one example, the ERF material may be deposited using, for example, a spin-on process, or, as another example, a plasma-enhanced chemical vapor deposition process (PECVD).

Figure 3:
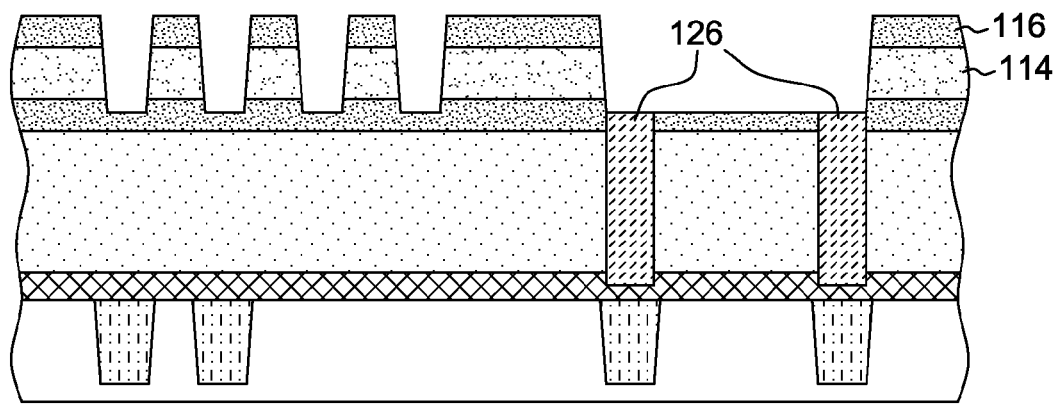
FIG. 3 depicts one example of the structure of FIG. 2 after removing the ERF material, except a remaining amount in the at least one other via below the layer of work function hard mask material, in accordance with one or more aspects of the present invention.

FIG. 3 depicts one example of the structure of FIG. 2 after removing the ERF material, except a remaining amount 126 in the at least one other via (e.g., vias 120 and 122, FIG. 1) below the layer 114 of work function hard mask material, in accordance with one or more aspects of the present invention. In one example, the partial ERF removal may be accomplished using, for example, a conventional etch process.

Figure 4:
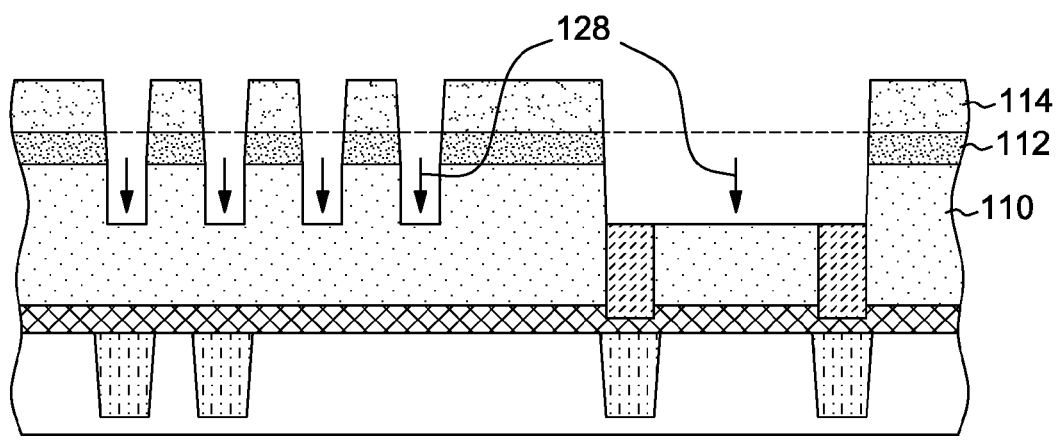
FIG. 4 depicts one example of the structure of FIG. 3 after removing the second layer of hard mask material, which also extends the vias through the first hard mask layer and into the dielectric layer, in accordance with one or more aspects of the present invention.

FIG. 4 depicts one example of the structure of FIG. 3 after removing the second layer (116, FIG. 3) of hard mask material, which also extends 128 the vias through the first hard mask layer 112 and into the dielectric layer 110, in accordance with one or more aspects of the present invention. In one example, removing the second layer of hard mask material may include, for example, a conventional etch process.

Figure 5:
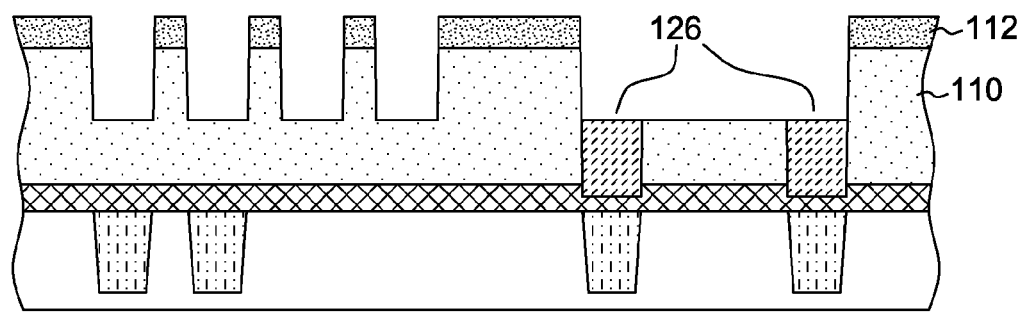
FIG. 5 depicts one example of the structure of FIG. 4 after removing the layer of work function hard mask material, in accordance with one or more aspects of the present invention.

FIG. 5 depicts one example of the structure of FIG. 4 after removing the layer (114, FIG. 4) of work function hard mask material, in accordance with one or more aspects of the present invention. In one example, removing the layer of work function material may include, for example, a conventional etch process.

Figure 6:
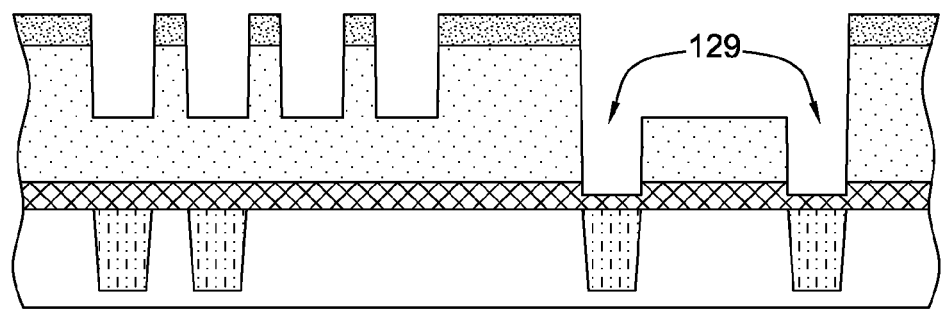
FIG. 6 depicts one example of the structure of FIG. 5 after removal of the remaining amount of ERF material, in accordance with one or more aspects of the present invention.

FIG. 6 depicts one example of the structure of FIG. 5 after removal of the remaining amount (126, FIG. 5) of ERF material, leaving open vias 129, in accordance with one or more aspects of the present invention. Complete removal of the remaining amount of ERF material may include, for example, Ultra-Violet curing thereof at about 400° C.

Although not necessary for the present invention, in practice, where chamfering is used, the vias on the left side of FIG. 6 may have chamfer angles of greater than about 45°, and the vias on the right side of FIG. 6 may have chamfer angles of greater than about 60°.

Figure 7:
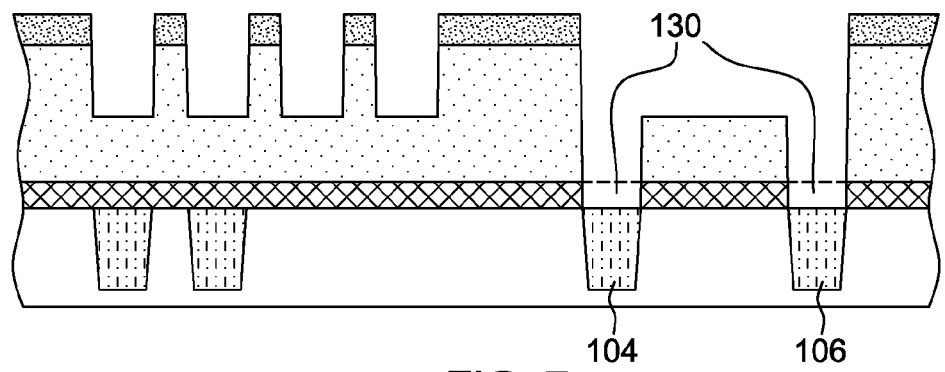
FIG. 7 depicts one example of the structure of FIG. 6 after removing a portion of the etch-stop layer to expose at least one contact, in accordance with one or more aspects of the present invention.

FIG. 7 depicts one example of the structure of FIG. 6 after removing a portion 130 of the etch-stop layer 108 to expose at least one contact (104 and 106), in accordance with one or more aspects of the present invention. Removing the portion of the etch-stop layer may be accomplished using, for example, a conventional etch process.

Figure 8:
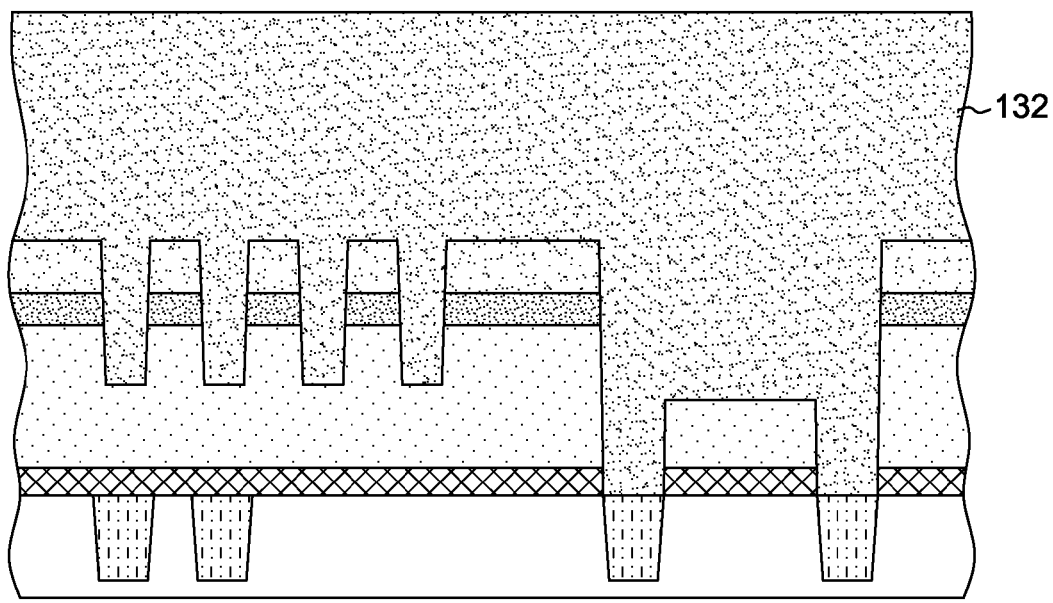
FIG. 8 depicts one example of the structure of FIG. 7 after filling the vias with metal, in accordance with one or more aspects of the present invention.

FIG. 8 depicts one example of the structure of FIG. 7 after filling the vias with metal 132, in accordance with one or more aspects of the present invention. The vias may be filled with, for example, tungsten, and the filling may be accomplished using one or more conventional processes and techniques.

Figure 9:
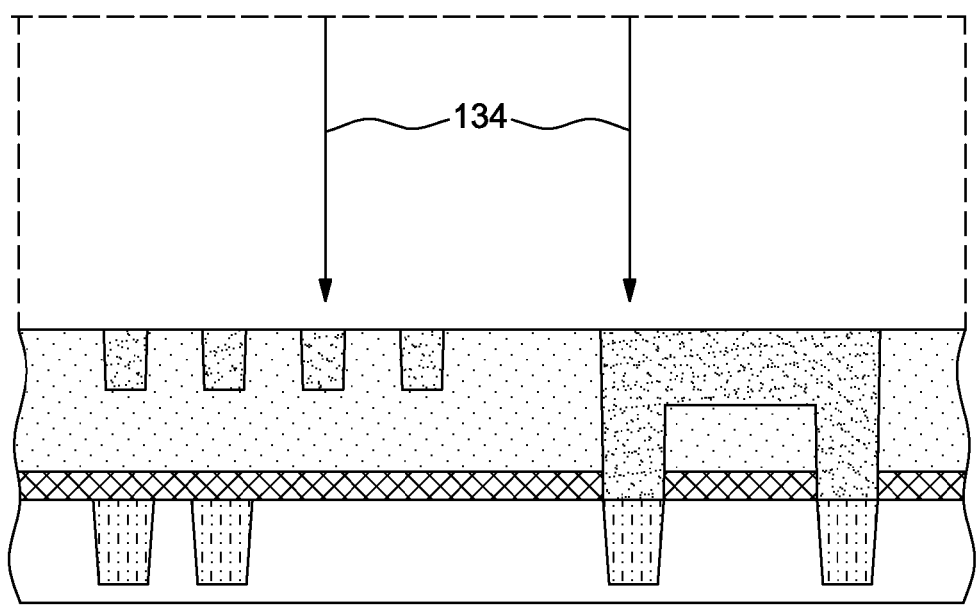
FIG. 9 depicts one example of the structure of FIG. 8 after planarizing the structure, in accordance with one or more aspects of the present invention.

FIG. 9 depicts one example of the structure of FIG. 8 after planarizing 134 the structure, in accordance with one or more aspects of the present invention. In one example, planarizing after the metal fill may be accomplished, for example, using a chemical-mechanical polishing (CMP) process.

In a first aspect, disclosed above is a method of reducing defects in and improving reliability of Back-End-Of-Line (BEOL) metal fill. As one skilled in the art will know, "BEOL" refers to a stage in fabrication after device creation, of making real-world electrical connections to the nanometer-sized device(s). The method includes providing a starting metallization structure for semiconductor device(s), the metallization structure including a bottom layer of contact(s) surrounded by a dielectric material. The starting metallization structure further includes an etch-stop layer over the bottom layer, a layer of dielectric material over the etch-stop layer, a first layer of hard mask material over the dielectric layer, a layer of work function hard mask material over the first hard mask layer, a second layer of hard mask material over the work function hard mask layer, via(s) to the first hard mask layer and other via(s) into the etch-stop layer. The method further includes protecting the at least one other via while removing the second hard mask layer and the layer of work function hard mask material, and filling the vias with metal.

In one example, protecting the at least one other via may include, for example, prior to removing the second hard mask layer and the layer of work function hard mask material, filling the other via(s) with an Energy Removal Film (ERF) up to a top surface of the first hard mask layer, and, after removing the second hard mask layer and the layer of work function hard mask material, removing the ERF material.

In one example, filling the other via(s) may include, for example, filling the vias with the ERF material, and removing the ERF material except leaving a remaining amount in the other via(s) below the layer of work function hard mask material.

In one example, removing the ERF material may include, for example, using ultraviolet light to evaporate the ERF material.

In one example, the ERF material in the method of the first aspect may include, for example, a polymer.

In one example, the method of the first aspect may further include, for example, between removing the ERF material and filling the vias with metal, removing a portion of the etch-stop layer to expose at least one contact.

In one example, removing the layer of work function hard mask material in the method of the first aspect may include, for example, performing a wet etch.

In one example, the method of the first aspect may further include, for example, planarizing the metal.

In one example, filling the vias with metal in the method of the first aspect may include, for example, filling the vias with copper.

In one example, removing the second hard mask layer in the method of the first aspect also extends the vias through the first hard mask layer and into the dielectric layer.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
    providing a starting metallization structure for one or more semiconductor devices, the metallization structure comprising a bottom layer of one or more contacts surrounded by a dielectric material, an etch-stop layer over the bottom layer, a layer of dielectric material over the etch-stop layer, a first layer of hard mask material over the dielectric layer, a layer of work function hard mask material over the first hard mask layer, a second layer of hard mask material over the work function hard mask layer, one or more first vias exposing the first hard mask layer below the one or more first vias and one or more second vias separate from the one or more first vias extending partially into the etch-stop layer;
    protecting the one or more second vias while removing entirely the second hard mask layer and the layer of work function hard mask material; and
    filling the one or more first vias and the one or more second vias with metal;
    wherein protecting the one or more second vias comprises:
        prior to the removing, filling the one or more second vias with an Energy Removal Film (ERF) up to a top surface of the first hard mask layer; and
        after the removing, removing the ERF material.

2. The method of claim 1, wherein filling the one or more second vias comprises:
    filling the one or more second vias with the ERF material; and
    removing the ERF material except leaving a remaining amount in the one or more second vias below the layer of work function hard mask material.

3. The method of claim 1, wherein removing the ERF material comprises using ultraviolet light to evaporate the ERF material.

4. The method of claim 1, wherein the ERF material comprises a polymer.

5. The method of claim 1, further comprising,
    between removing the ERF material and filling the one or more first vias and the one or more second vias with metal, removing a portion of the etch-stop layer to expose at least one contact of the one or more contacts.

6. The method of claim 1, wherein removing the layer of work function hard mask material comprises performing a wet etch.

7. The method of claim 1, further comprising planarizing the metal.

8. The method of claim 1, wherein filling the one or more first vias and the one or more second vias with metal comprises filling the one or more first vias and the one or more second vias with copper.

9. The method of claim 1, wherein removing the second hard mask layer also extends the one or more first vias and the one or more second vias through the first hard mask layer and into the dielectric layer.

* * * * *